United States Patent
Ishikawa et al.

(10) Patent No.: US 11,597,100 B2
(45) Date of Patent: Mar. 7, 2023

(54) COMPONENT MOUNTING SYSTEM

(71) Applicant: FUJI CORPORATION, Chiryu (JP)

(72) Inventors: Kenzo Ishikawa, Kariya (JP); Jun Iisaka, Nisshin (JP); Hidetoshi Ito, Okazaki (JP)

(73) Assignee: FUJI CORPORATION, Chiryu (JP)

(*) Notice: Subject to any disclaimer, the term of this patent is extended or adjusted under 35 U.S.C. 154(b) by 219 days.

(21) Appl. No.: 17/051,318

(22) PCT Filed: May 30, 2018

(86) PCT No.: PCT/JP2018/020808
§ 371 (c)(1),
(2) Date: Oct. 28, 2020

(87) PCT Pub. No.: WO2019/229884
PCT Pub. Date: Dec. 5, 2019

(65) Prior Publication Data
US 2021/0237282 A1 Aug. 5, 2021

(51) Int. Cl.
*B25J 15/06* (2006.01)
*B25J 9/16* (2006.01)
(Continued)

(52) U.S. Cl.
CPC ......... *B25J 15/0616* (2013.01); *B25J 9/1612* (2013.01); *B25J 13/088* (2013.01);
(Continued)

(58) Field of Classification Search
CPC .... B25J 9/1612; B25J 13/088; B25J 15/0052; B25J 15/0616; H05K 13/087; H05K 13/049; H05K 13/041
See application file for complete search history.

(56) References Cited

U.S. PATENT DOCUMENTS

| 7,488,283 B2 * | 2/2009 | Yasui | H05K 13/0409 483/1 |
| 10,555,450 B2 * | 2/2020 | Iisaka | H05K 13/08 |

(Continued)

FOREIGN PATENT DOCUMENTS

| JP | 8-222895 A | 8/1996 |
| JP | 2005-286171 A | * 10/2005 |

(Continued)

OTHER PUBLICATIONS

International Search Report dated Sep. 4, 2018 in PCT/JP2018/020808 filed on May 30, 2018, 2 pages.

*Primary Examiner* — Carl J Arbes
(74) *Attorney, Agent, or Firm* — Oblon, McClelland, Maier & Neustadt, L.L.P.

(57) ABSTRACT

A component mounting system includes a head to revolve multiple suction nozzles in a circumferential direction, a lifting and lowering device configured to lift and lower a suction nozzle at a predetermined revolving position, a storage device configured to store any one of multiple pieces of directionality information in association with identification information of the suction nozzle, and a control device configured to acquire corresponding directionality information from the storage device based on the acquired identification information of the suction nozzle and to perform pickup of the component supplied from the component supply device at the spinning position in accordance with the directionality information.

3 Claims, 9 Drawing Sheets

(51) Int. Cl.
  *B25J 13/08* (2006.01)
  *B25J 15/00* (2006.01)
  *H05K 13/04* (2006.01)
  *H05K 13/08* (2006.01)

(52) U.S. Cl.
  CPC ........ *B25J 15/0052* (2013.01); *H05K 13/041* (2018.08); *H05K 13/0409* (2018.08); *H05K 13/087* (2018.08)

(56) References Cited

U.S. PATENT DOCUMENTS

| | | |
|---|---|---|
| 2016/0219761 A1 | 7/2016 | Nishiyama |
| 2017/0318714 A1 | 11/2017 | Nishiyama |
| 2019/0254201 A1 | 8/2019 | Iisaka et al. |

FOREIGN PATENT DOCUMENTS

| | | |
|---|---|---|
| JP | WO2015/004814 A1 | 1/2015 |
| JP | WO2015/083414 A1 | 6/2015 |
| JP | WO2018/011907 A1 | 1/2018 |
| WO | 2016072014 A1 * | 5/2016 |

* cited by examiner (a)

(b)

(c)

(d)

COMPONENT MOUNTING SYSTEM

TECHNICAL FIELD

The present specification relates to a component mounting system.

BACKGROUND ART

Conventionally, as a component mounting system of this type, a system including a component mounter that picks up a component supplied from a component supply device (feeder) and mounts the component on a target object, such as a board, is known. For example, Patent Literature 1 discloses a device including a rotary head that holds multiple nozzle holders, each holding a suction nozzle, in a circumferential direction, can revolve each nozzle holder in the circumferential direction, and can simultaneously spin each nozzle holder and a lifting and lowering device that can lift and lower a nozzle holder at a predetermined revolving position, among the multiple nozzle holders. The component supply device has two component supply devices that respectively supply components at positions spaced apart from each other at a predetermined pitch in a board conveyance direction. In addition, the lifting and lowering device includes two lifting and lowering devices that can respectively lift and lower a nozzle holder at a first revolving position and a nozzle holder at a second revolving position spaced apart from the first revolving position in the board conveyance direction by the predetermined pitch, among the multiple nozzle holders. Further, the head spins the multiple nozzle holders such that the spinning position of the suction nozzle mounted on the nozzle holder at the first revolving position and the spinning position of the suction nozzle mounted on the nozzle holder at the second revolving position are in a relationship of being different from each other by 180 degrees. In a case where the suction nozzles used in picking up a component have 180-degree rotational symmetry, the component mounter controls the two lifting and lowering devices such that two components supplied from the two component supply devices are picked up substantially simultaneously.

PATENT LITERATURE

Patent Literature 1: WO 2018/011907A1

BRIEF SUMMARY

Technical Problem

However, Patent Literature 1 describes an operation in a case of picking up a component using a suction nozzle having 180-degree (two-direction) rotational symmetry, but does not mention to any operation in a case of using a suction nozzle having other multi-direction rotational symmetry.

A main object of the present disclosure is to enable efficient pickup of a component using a suction nozzle in accordance with the type of rotational symmetry of the suction nozzle.

Solution to Problem

The present disclosure has adopted the following means to achieve the main object described above.

A component mounting system of the present disclosure is configured to pick up a component supplied from a component supply device and to mount the component on a target object; the component mounting system includes multiple suction nozzles, each capable of picking up the component, a rotary head configured to hold the multiple suction nozzles in a circumferential direction, and to be capable of revolving each suction nozzle in the circumferential direction and simultaneously spinning each suction nozzle, a lifting and lowering device configured to lift and lower a suction nozzle at a predetermined revolving position, among the multiple suction nozzles, a storage device configured to store any one of multiple pieces of directionality information in association with identification information of the suction nozzle, the multiple pieces of directionality information including at least: no directionality in which the component supplied from the component supply device is able to be picked up at any spinning position; one direction in which the component supplied from the component supply device is able to be picked up only at one specific spinning position; two directions in which the component supplied from the component supply device is able to be picked up only at any one of two specific spinning positions; and four directions in which the component supplied from the component supply device is able to be picked up only at any one of four specific spinning positions, and a control device configured to acquire the identification information of the suction nozzle used in picking up the component, to acquire the corresponding directionality information from the storage device based on the acquired identification information, and to control the head and the suction nozzle such that the component supplied from the component supply device is picked up at the spinning position in accordance with the acquired directionality information.

The component mounting system of the present disclosure includes the rotary head, the lifting and lowering device, and the storage device that stores, in association with the identification information of the suction nozzle, any directionality information including at least no directionality, one direction, two directions, and four directions. The directionality information of no directionality is information indicating that the component supplied from the component supply device can be picked up at any spinning position. The directionality information of one direction is information indicating that the component supplied from the component supply device can be picked up only at one specific spinning position. The directionality information of two directions is information indicating that the component supplied from the component supply device can be picked up only at any one of two specific spinning positions. The directionality information of four directions is information indicating that the component supplied from the component supply device can be picked up only at any one of four specific spinning positions. Then, the component mounting system acquires the identification information of the suction nozzle used in picking up the component, acquires the corresponding directionality information from the storage device based on the acquired identification information, and controls the head and the suction nozzle such that the component supplied from the component supply device is picked up at the spinning position in accordance with the acquired directionality information. Accordingly, by storing the directionality information of the suction nozzle, the component mounting system can efficiently pick up the component and mount the component on the target object in accordance with the directionality information.

DESCRIPTION OF EMBODIMENTS

Next, an embodiment of the present disclosure will be described with reference to the drawings.

Figure 1:
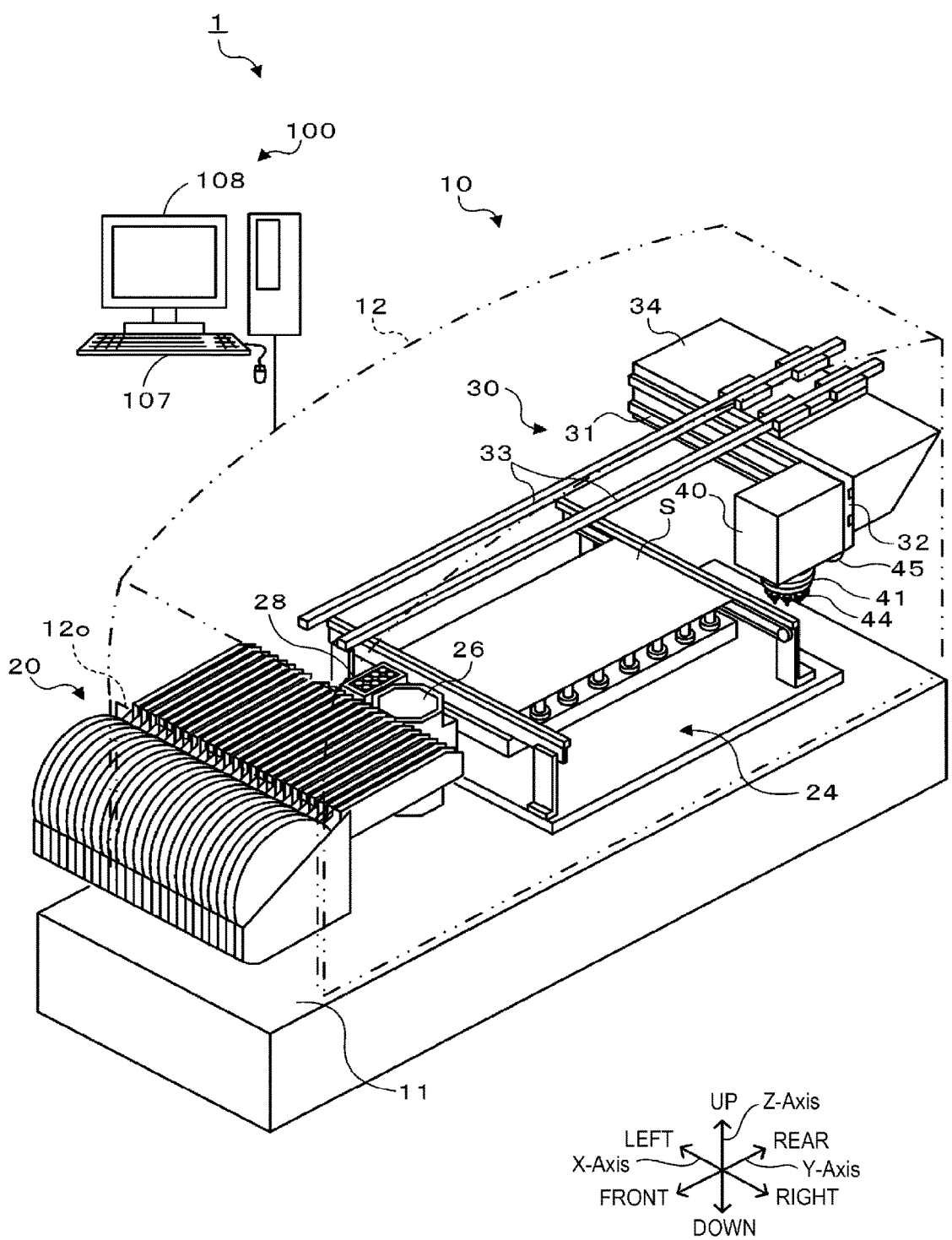
FIG. 1 A configuration view showing a schematic configuration of component mounting system 1.
Figure 2:
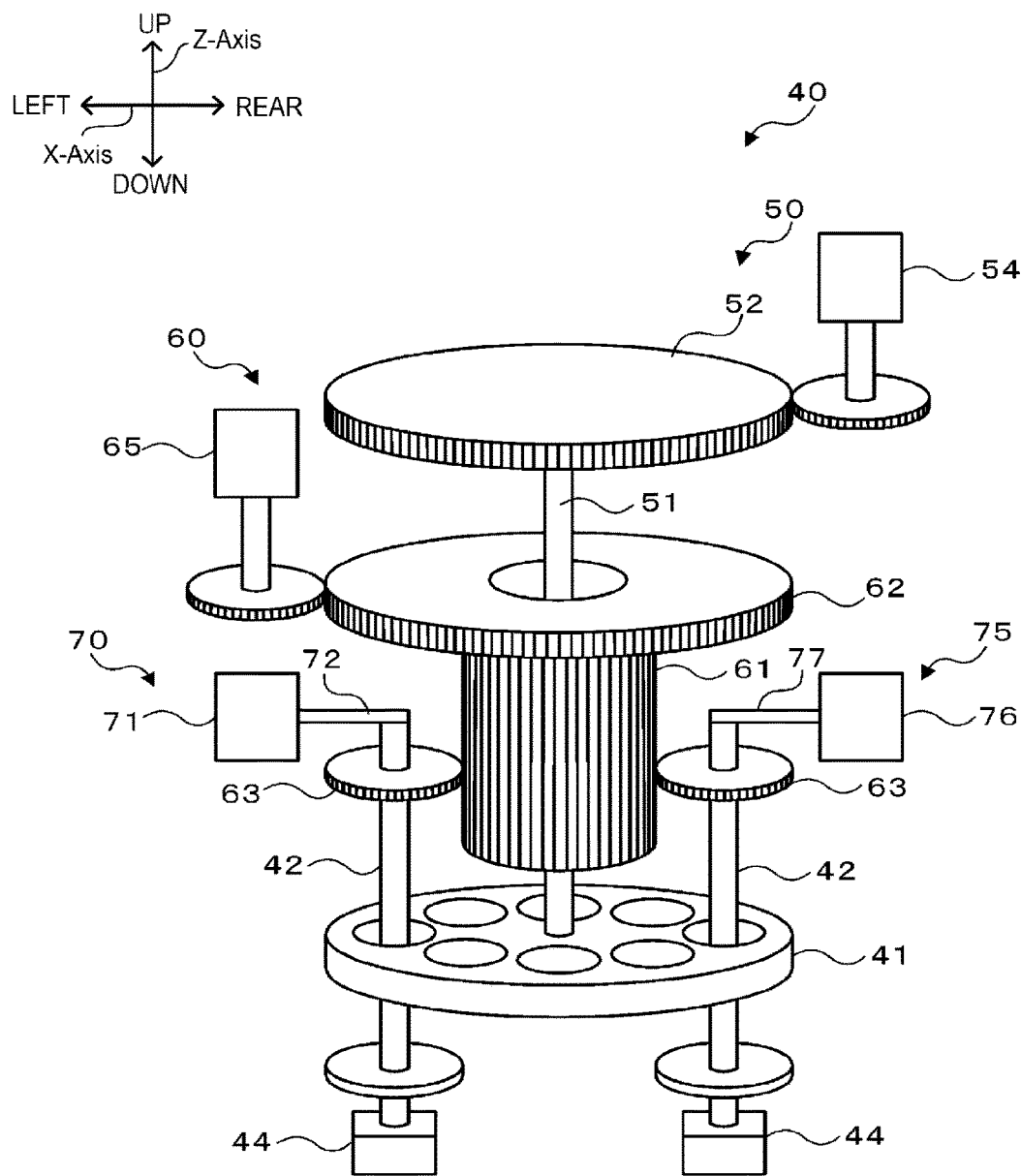
FIG. 2 A configuration view showing a schematic configuration of mounting head 40.
Figure 3:
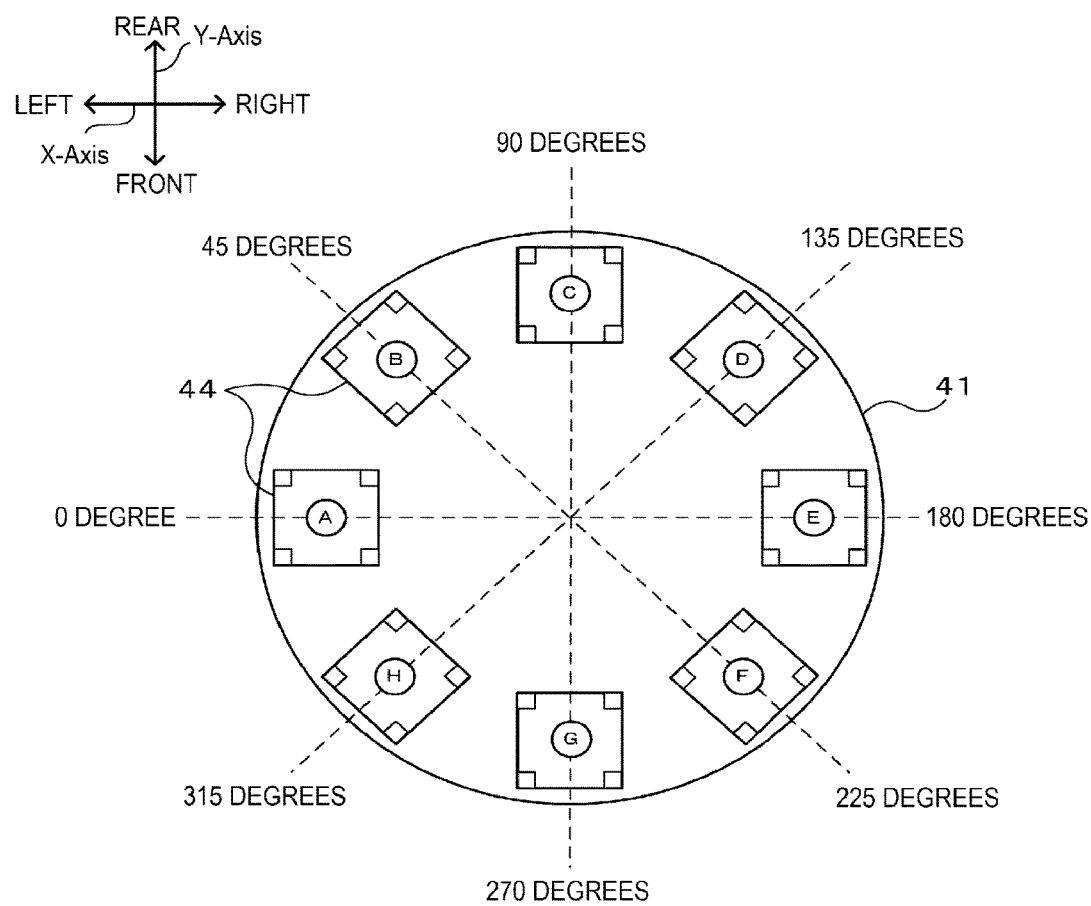
FIG. 3 An explanatory diagram showing a state of arrangement of suction nozzle 44.
Figure 4:
FIG. 4 An explanatory diagram showing shapes of pickup ports of suction nozzles 44a to 44d.
Figure 4:
Figure 4:
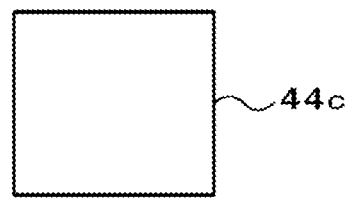
Figure 4:
Figure 5:
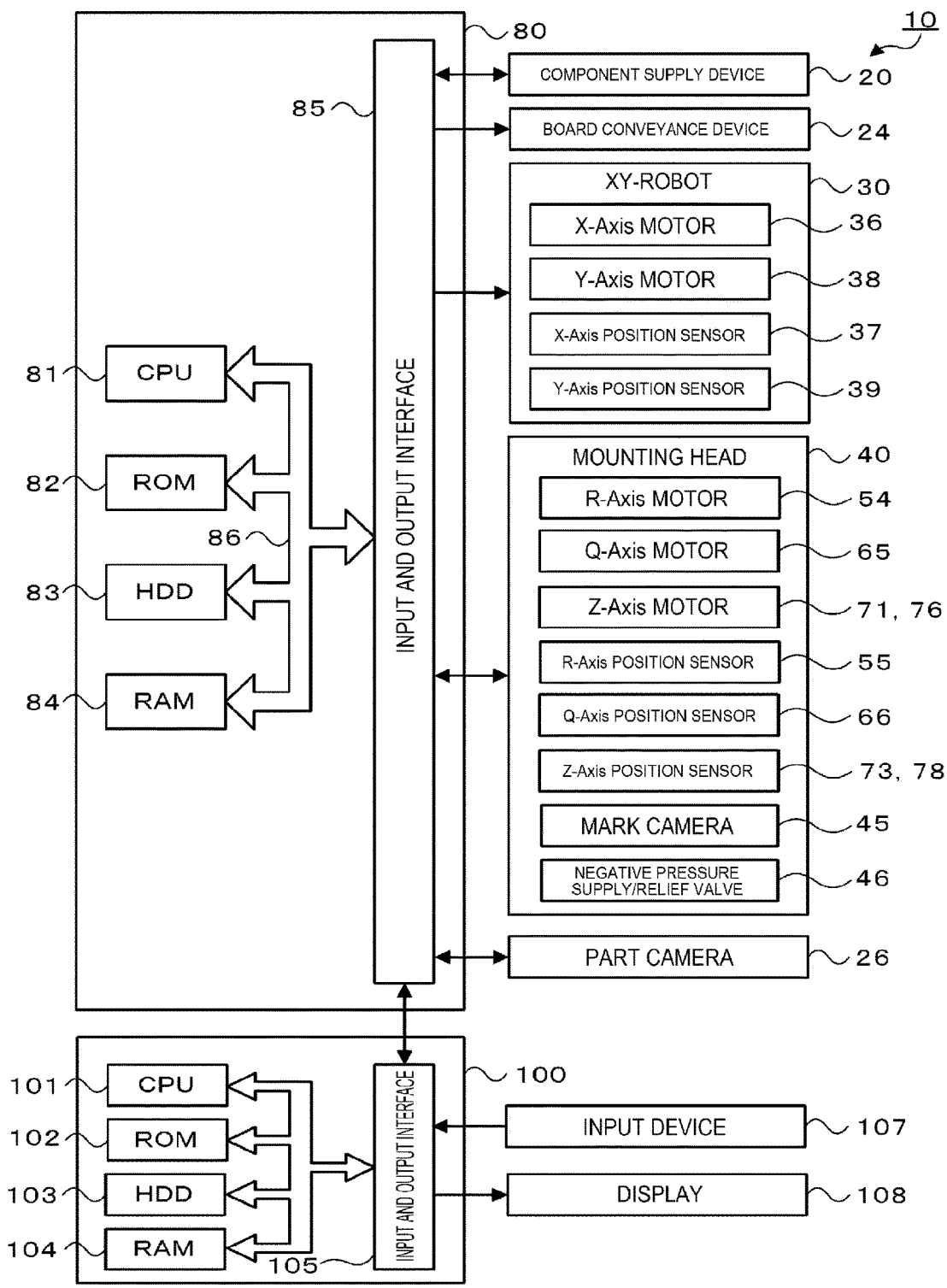
FIG. 5 An explanatory diagram showing an electrical connection relationship between control device 80 and management device 100.

FIG. 1 is a configuration view showing a schematic configuration of component mounting system 1. FIG. 2 is a configuration view showing a schematic configuration of mounting head 40. FIG. 3 is an explanatory diagram showing a state of arrangement of suction nozzle 44. FIG. 4 is an explanatory diagram showing shapes of pickup ports of suction nozzles 44a to 44d. FIG. 5 is an explanatory diagram showing an electrical connection relationship between control device 80 and management device 100. In FIG. 1, a right-left direction is an X-axis direction, a front (near side)-rear (far side) direction is a Y-axis direction, and an up-down direction is a Z-axis direction.

As shown in FIG. 1, component mounting system 1 includes multiple component mounters 10, which are disposed side by side in a board S conveyance direction to configure a component mounting line, and management device 100 that controls the entire system.

As shown in FIG. 1, component mounter 10 includes component supply device 20 that supplies component P to a component supply position, board conveyance device 24 that conveys board S, mounting head 40 that picks up component P supplied to the component supply position and mounts component P on board S, XY-robot 30 that moves mounting head 40 in X- and Y-axis directions, and control device 80 (refer to FIG. 5) that controls the entire mounter. Component supply device 20, board conveyance device 24, mounting head 40, and XY-robot 30 are disposed in housing 12 supported on base 11. In addition thereto, component mounter 10 also includes part camera 26 for imaging a posture of component P picked up by mounting head 40, nozzle station 28 for accommodating suction nozzle 44 for exchange which can be mounted on mounting head 40 (nozzle holder 42), and mark camera 45 which is provided on mounting head 40 and is for reading a positioning reference mark attached to board S. An ID mark, in which identification information (nozzle ID) of suction nozzle 44 is recorded, is attached to each suction nozzle 44 accommodated in nozzle station 28.

Component supply device 20 is configured as a tape feeder that supplies component P to the component supply position by pulling out tape, which accommodates component P at a predetermined interval thereon, from a reel and sending the tape pitch by pitch. Multiple component supply devices 20 are provided such that component supply devices 20 are inserted from opening sections 12o provided in a front part of housing 12 and are arranged in a board conveyance direction (in the drawing, the right-left direction, that is, the X-axis direction).

Board conveyance device 24 has a pair of conveyor belts which are provided with an interval in the front-rear direction of FIG. 1 and are wound around in the right-left direction. Board S is conveyed by the conveyor belts.

As shown in FIG. 1, XY-robot 30 includes X-axis guide rail 31, X-axis slider 32, Y-axis guide rail 33, and Y-axis slider 34. Y-axis guide rail 33 is a pair of right and left guide rails provided on an upper stage section of the housing 12 along the front-rear direction (Y-axis direction). Y-axis slider 34 is provided to straddle a pair of right and left Y-axis guide rails 33, and is movable in the Y-axis direction by the driving of Y-axis motor 38 (refer to FIG. 5). The position of Y-axis slider 34 in the Y-axis direction is detected by Y-axis position sensor 39. X-axis guide rail 31 is a pair of upper and lower guide rails provided on a side surface of Y-axis slider 34 along the right-left direction (board conveyance direction, or X-axis direction). X-axis slider 32 is provided to straddle a pair of upper and lower X-axis guide rails 31, and is movable in the X-axis direction by the driving of X-axis motor 36 (refer to FIG. 5). The position of X-axis slider 32 in the X-axis direction is detected by X-axis position sensor 37. Mounting head 40 is attached to X-axis slider 32. As control device 80 causes XY-robot 30 (X-axis motor 36 and Y-axis motor 38) to be driven, mounting head 40 can move to any position within a predetermined range on an XY-plane.

As shown in FIG. 2, mounting head 40 includes head main body 41, nozzle holder 42, suction nozzle 44, R-axis driving device 50, Q-axis driving device 60, and first and second Z-axis driving devices 70 and 75.

Head main body 41 is configured as a cylindrical rotating body. Nozzle holders 42 are arranged in head main body 41 at a predetermined angular interval (for example, a 45-degree interval) in a circumferential direction and are supported by head main body 41 so as to be freely lifted and lowered. Suction nozzle 44 is attached to a tip section of nozzle holder 42. Head main body 41 includes eight nozzle holders 42 at a 45-degree interval in the present embodiment; however, without being limited to this, any configuration can also be adopted insofar as head main body 41 includes multiple nozzle holders at a predetermined angular interval, for example, two at a 180-degree interval, four at 90-degree intervals, and sixteen at 22.5-degree intervals.

R-axis driving device 50 causes multiple suction nozzles 44 to revolve in the circumferential direction around a central shaft of head main body 41 (revolution). R-axis driving device 50 includes R-shaft 51 that extends in the up-down direction and has a lower end attached to the central shaft of head main body 41 and R-axis motor 54 that rotatably drives R-axis gear 52 provided at an upper end of R-shaft 51. R-axis driving device 50 rotatably drives R-axis gear 52 with R-axis motor 54 to rotate head main body 41 together with R-shaft 51, thereby revolving multiple nozzle holders 42 supported by head main body 41 in the circumferential direction together with multiple suction nozzles 44 (revolution). In addition, R-axis driving device 50 also includes R-axis position sensor 55 (refer to FIG. 5) that detects the rotational position of R-axis motor 54.

Q-axis driving device 60 rotates (spins) each suction nozzle 44 about a central shaft thereof. Q-axis driving device 60 includes two upper and lower hollow stages of Q-axis gears 61 and 62 that are inserted to be concentric and relatively rotatable with respect to R-shaft 51, holder gear 63 that is provided above each nozzle holder 42 and meshes slidably in the up-down direction with Q-axis gear 61 on the lower stage, and Q-axis motor 65 that rotatably drives Q-axis gear 62 on the upper stage. Q-axis driving device 60 rotatably drives Q-axis gear 62 with Q-axis motor 65 to rotate Q-axis gear 61 integrally with Q-axis gear 62; holder gear 63 meshing with Q-axis gear 61 rotates, thereby rotating each nozzle holder 42 about a central shaft thereof. Since suction nozzle 44 is attached to the tip section of nozzle holder 42, suction nozzle 44 rotates (spins) integrally with nozzle holder 42 as nozzle holder 42 rotates (spins). Holder gear 63 provided above each nozzle holder 42 is a gear having the same number of gear teeth and normally meshes with Q-axis gear 61. For this reason, when Q-axis gear 61 rotates, all nozzle holders 42 (suction nozzles 44) rotate (spin) the same rotation amount in the same rotational direction. In addition, Q-axis driving device 60 also includes Q-axis position sensor 66 (refer to FIG. 5) that detects the rotational position of Q-axis motor 65.

Z-axis driving devices 70 and 75 are provided at two locations on a revolving trajectory of nozzle holders 42 (revolution) and can lift and lower nozzle holders 42 individually at the two locations. In the present embodiment, Z-axis driving devices 70 and 75 are provided at positions where the rotation angle of head main body 41 is 0 degree and 180 degrees. Herein, the position of 0 degree is a position on an opposite direction to the board conveyance direction (X-axis direction) with respect to the central shaft of head main body 41 (position A in FIG. 3), and the position of 180 degrees is a position in the board conveyance direction with respect to the central shaft of head main body 41 (position E in FIG. 3). As shown in FIG. 2, Z-axis driving devices 70 and 75 include Z-axis sliders 72 and 77 and Z-axis motors 71 and 76 that lift and lower Z-axis sliders 72 and 77, respectively. Z-axis driving device 70 drives Z-axis motor 71 to lift and lower Z-axis slider 72 such that nozzle holder 42 below Z-axis slider 72 is lifted and lowered integrally with suction nozzle 44. Z-axis driving device 75 drives Z-axis motor 76 to lift and lower Z-axis slider 77 such that nozzle holder 42 below Z-axis slider 77 is lifted and lowered integrally with suction nozzle 44. Z-axis motors 71 and 76 may lift and lower Z-axis sliders 72 and 77 using linear motors, or may lift and lower Z-axis sliders 72 and 77 using rotation motors and feeding screw mechanisms. In addition, Z-axis sliders 72 and 77 may be lifted and lowered using actuators such as air cylinders, instead of Z-axis motors 71 and 76. In addition, Z-axis driving devices 70 and 75 also include Z-axis position sensors 73 and 78 (refer to FIG. 5) that detect the lifting and lowering positions of Z-axis sliders 72 and 77.

Suction nozzle 44 picks up component P supplied from component supply device 20 by a negative pressure which is supplied and relieved from a negative pressure source (not shown) via negative pressure supply/relief valve 46 (refer to FIG. 5). Suction nozzle 44 is exchangeably attached to the tip section of each nozzle holder 42 supported by head main body 41. Although suction nozzle 44*a* (refer to FIG. 4(*a*)) having a circular suction port is used in general as suction nozzle 44, special nozzles such as suction nozzle 44*b* (refer to FIG. 4(*b*)) having a rectangular suction port, suction nozzle 44*c* (refer to FIG. 4(*c*)) having a square suction port, and suction nozzle 44*d* (refer to FIG. 4(*d*)) having a trapezoidal suction port are used depending on the shape of component P to be picked up. In a case where component P is picked up using the normal nozzle (suction nozzle 44*a*), mounting head 40 can pick up component P even if suction nozzle 44*a* spins in any direction (nozzle angle) with respect to a direction of component P to be supplied (component angle). On the other hand, in a case where component P is picked up using a special nozzle (suction nozzles 44*b* to 44*d*) different from the normal nozzle, mounting head 40 generally performs pickup after matching a reference direction of component P (component angle of 0 degree) with a reference direction of suction nozzle 44 (nozzle angle of 0 degree) since there is a restriction of a direction in which component P can be picked up (nozzle angle) with respect to the direction of component P to be supplied (component angle). As shown in FIG. 3, mounting head 40 of the present embodiment has eight suction nozzles 44 that are arranged at equal angular intervals (45-degree intervals) in the circumferential direction with respect to head main body 41; suction nozzle 44 at the position of 0 degree (position A) on head main body 41 and suction nozzle 44 at the position of 180 degrees (position E) on head main body 41 can be lifted and lowered by Z-axis driving devices 70 and 75. In addition, directions (nozzle angles) of multiple (eight) suction nozzles 44 are determined such that suction nozzles 44 are directed in a radial direction with respect to the central shaft of head main body 41, and the directions (nozzle angles) of two suction nozzles which are lifted and lowered by two Z-axis driving devices 70 and 75 are in a relationship where the directions are different from each other by 180 degrees. In a case where special nozzles (suction nozzles 44*b* to 44*d*) are attached to such mounting head 40 and two special nozzles pick up two components P supplied in the same direction (component angle), when pickup is performed by aligning the reference direction (nozzle angle of 0 degree) of first suction nozzle 44 with the reference direction (component angle of 0 degree) of first component P, the direction of second suction nozzle 44 is brought into a state shifted by 180 degrees with respect to the reference direction of second component P. For this reason, mounting head 40 performs pickup of second component P by second suction nozzle 44 by revolving second suction nozzle 44 180 degrees or spinning second suction nozzle 44 180 degrees.

On the contrary, in a case where special nozzles can pick up components P in multiple directions in a symmetric manner (two-direction suction nozzle 44*b* and four-direction suction nozzle 44*c* in FIG. 4), mounting head 40 can shorten time required for pickup by picking up components P in a direction (nozzle angle) in which the movement amount of the special nozzle is small, among the multiple directions. For example, a case is considered where component supply device 20 supplies two components P at the same component angle to two component supply positions that are spaced apart from each other at a predetermined interval in the X-axis direction, and mounting head 40 lifts and lowers two special nozzles that are spaced apart from each other at an interval equal to the predetermined distance in the X-axis direction to pick up components P. In this case, if the special nozzles are two-direction suction nozzles 44*b* or four-direction suction nozzles 44*c*, mounting head 40 can pick up two components P substantially simultaneously as Z-axis driving devices 70 and 75 lower the two special nozzles substantially simultaneously.

On the other hand, in a case where a special nozzle can pick up component P in only one direction (nozzle angle of 0 degree) in an asymmetric manner (suction nozzle 44d), when pickup is performed by aligning the reference direction of first suction nozzle 44 with the reference direction (component angle of 0 degree) of first component P as described above, the direction of second suction nozzle 44 is brought into a state shifted 180 degrees with respect to the reference direction of second component P. For this reason, mounting head 40 performs pickup of second component P by second suction nozzle 44 by revolving second suction nozzle 44 180 degrees or spinning second suction nozzle 44 180 degrees.

As shown in FIG. 5, control device 80 is configured as a microprocessor centered on CPU 81 and includes, in addition to CPU 81, ROM 82, HDD 83, RAM 84, and input and output interface 85. These are connected to each other via bus 86. Detection signals from XY-robot 30 (X-axis position sensor 37 and Y-axis position sensor 39), detection signals from mounting head 40 (R-axis position sensor 55, Q-axis position sensor 66, and Z-axis position sensors 73 and 78), and an image signal from part camera 26 are inputted into control device 80 via input and output interface 85. In addition, control device 80 outputs a control signal for component supply device 20, a control signal for board conveyance device 24, control signals for XY-robot 30 (X-axis motor 36 and Y-axis motor 38), control signals for mounting head 40 (R-axis motor 54, Q-axis motor 65, and Z-axis motors 71 and 76), a control signal for negative pressure supply/relief valve 46, and control signals for part camera 26 and mark camera 45 via input and output interface 85.

Figure 6:
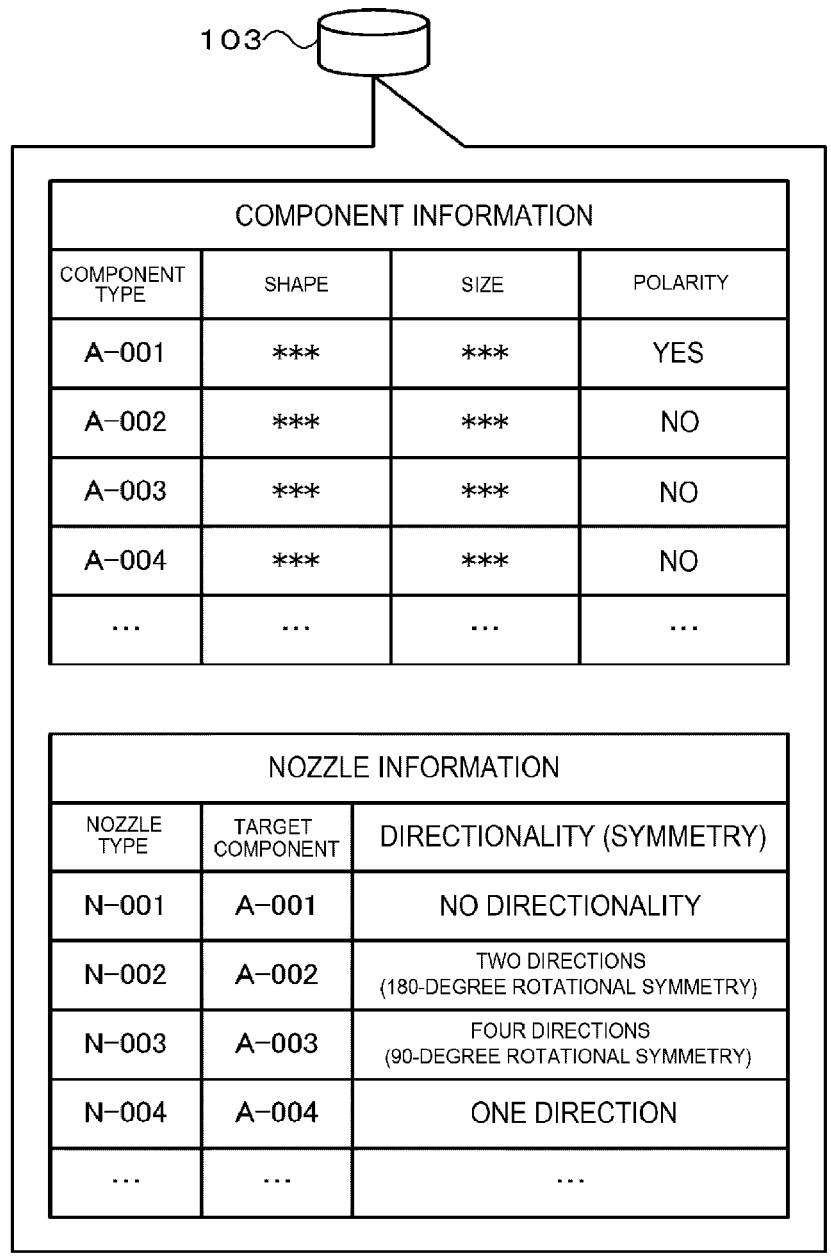
FIG. 6 An explanatory diagram showing an example of nozzle information.

Management device 100 is, for example, a general-purpose computer and includes CPU 101, ROM 102, HDD 103, RAM 104, and input and output interface 105, as shown in FIG. 5. Input device 107, such as a keyboard and a mouse, and display 108, such as an LCD, are connected to management device 100. An input signal from input device 107 is inputted into management device 100 via input and output interface 105, and management device 100 outputs a display signal for display 108 via input and output interface 105. HDD 103 stores production programs of boards S and job information including other production information. Herein, the production program refers to a program that determines which component P is to be mounted on which board S in which order and the number of boards S, on which a component is mounted in such a manner, to be made, in component mounter 10. In addition, the production information includes component information on mounting target component P, nozzle information on suction nozzle 44 to be used, the mounting position (XY-coordinates) of component P on board S, a mounting angle thereof, and the like. FIG. 6 is an explanatory diagram showing an example of component information and nozzle information. As shown, the component information includes component types, shapes, sizes, and polarities. The polarity is information indicating a mounting angle at which component P can be mounted. "Yes" indicates that there is only one angle at which a component can be mounted. "No" indicates that there are multiple angles at which a component can be mounted in symmetric directions. The nozzle information includes nozzle types, target components, and directionality (symmetry) information. The directionality (symmetry) information is information defining the direction (nozzle angle) of suction nozzle 44 in which component P can be mounted with respect to the reference direction (component angle of 0 degree) of supplied component P; any one of "no directionality", "two directions (180-degree rotational symmetry)", "four directions (90-degree rotational symmetry)", and "one direction" is stored for each suction nozzle 44 in the present embodiment. "No directionality" is information that indicates component P can be picked up even when suction nozzle 44 is in any direction with respect to the reference direction (component angle of 0 degree) of component P. "Two directions (180-degree rotational symmetry)" is information that indicates component P can be picked up only in two directions including a direction in which suction nozzle 44 is at 0 degree and a direction in which suction nozzle 44 is at 180 degrees with respect to the reference direction of component P. "Four directions (90-degree rotational symmetry)" is information that indicates component P can be picked up only in four directions including a direction in which suction nozzle 44 is at 0 degree, a direction in which suction nozzle 44 is at 90 degrees, a direction in which suction nozzle 44 is at 180 degrees, and a direction in which suction nozzle 44 is at 270 degrees with respect to the reference direction (0 degree) of component P. "One direction" is information that indicates component P can be picked up only in a direction in which suction nozzle 44 is at 0 degree with respect to the reference direction (0 degree) of component P. Management device 100 is connected to control device 80 so as to be able to communicate therewith and exchanges various information and control signals with control device 80.

Figure 7:
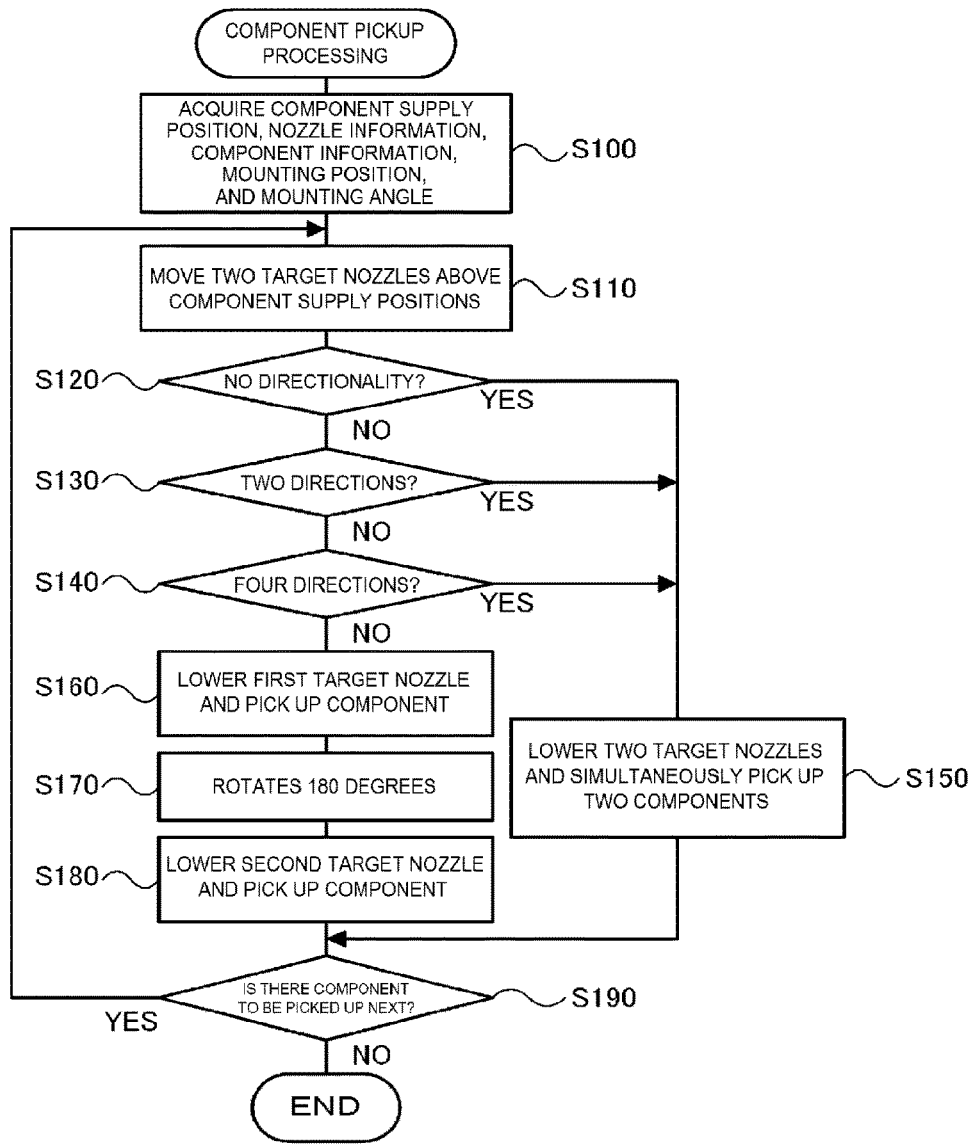
FIG. 7 A flowchart showing an example of component pickup processing.

Next, an operation of component mounter 10 of the present embodiment configured in such a manner, and in particular, an operation of picking up component P with the use of a special nozzle and mounting component P on board S will be described. FIG. 7 is a flowchart showing an example of component pickup processing executed by CPU 81 of control device 80. This processing is executed when job information is received from management device 100.

When the component pickup processing is executed, CPU 81 of control device 80 first acquires a component supply position, component information, a mounting position, and a mounting angle from the job information received from management device 100 and acquires nozzle information (Step S100). Herein, the nozzle information can be acquired, for example, as follows. That is, CPU 81 first reads an ID mark attached to suction nozzle 44 with mark camera 45 when mounting suction nozzle 44, which is accommodated in nozzle station 28, on nozzle holder 42. Next, CPU 81 extracts identification information of suction nozzle 44 from the read ID mark. Then, CPU 81 transmits the extracted identification information to management device 80, and acquires corresponding nozzle information from HDD 103 of management device 100.

When various information is acquired in this manner, CPU 81 drives and controls XY-robot 30 (X-axis motor 36 and Y-axis motor 38) and R-axis motor 54 such that two suction nozzles 44 (target nozzles) which can be lifted and lowered by Z-axis driving devices 70 and 75 move above component supply positions (Step S110). In the present embodiment, mounting head 40 has two Z-shafts that can lift and lower suction nozzles 44 (nozzle holders 42). An interval between the two Z-shafts in the X-axis direction matches an interval between two components P supplied from two of multiple component supply devices 20 in the X-axis direction.

Next, CPU 81 determines whether directionality (symmetry) information included in nozzle information of the two target nozzles is "no directionality" (Step S120), whether the directionality (symmetry) information is "two directions" (Step S130), and whether the directionality (symmetry) information is "four directions" (Step S140). When it is determined that the directionality information of the two target nozzles is any one of "no directionality", "two directions", and "four directions", CPU 81 drives and controls Z-axis driving devices 70 and 75 and negative pressure supply/relief valve 46 such that the two target nozzles are lowered substantially simultaneously with respect to pickup target components P (pickup target components) and respectively pick up components P substantially simultaneously (Step S150).

On the other hand, when it is determined that the directionality information of the two target nozzles is not any one of "no directionality", "two directions", and "four directions", CPU 81 determines that the directionality information is "one direction", and drives and controls a first one of Z-axis driving devices 70 and 75 and negative pressure supply/relief valve 46 such that a first one of the two target nozzles is lowered and picks up component P (Step S160). Then, CPU 81 drives and controls Q-axis motor 65 such that a second target nozzle rotates (spins) 180 degrees (Step S170), while driving and controlling a second one of Z-axis driving devices 70 and 75 and negative pressure supply/relief valve 46 such that the second target nozzle is lowered and picks up component P (Step S180).

When the two target nozzles respectively pick up components P in this manner, CPU 81 determines whether there are components P to be picked up next (Step S190); when CPU 81 determines that there are components P to be picked up next, CPU 81 returns to Step S110 and moves the next two target nozzles to the component supply positions to repeat the processing of Steps S120 to S190. On the other hand, when CPU 81 determines that there is no component P to be picked up next, the component pickup processing is ended.

When the component pickup processing is ended, CPU 81 shifts to component mounting processing of mounting picked up component P at a mounting position on board S. That is, CPU 81 first drives and controls XY-robot 30 such that component P picked up by each suction nozzle 44 of mounting head 40 moves above part camera 26. Subsequently, CPU 81 causes part camera 26 to image component P picked up by each suction nozzle 44 of mounting head 40, and performs image processing on the obtained captured image to correct the mounting position. When the mounting position is corrected, CPU 81 drives and controls XY-robot 30 such that a target nozzle moves above the mounting position, and drives and controls a corresponding Z-axis driving device and Q-axis driving device 60 such that component P, being picked up by lowering the target nozzle, is mounted at a mounting angle at the mounting position on board S. Then, CPU 81 determines whether there is component P to be mounted next; when it is determined that there is component P to be mounted next, CPU 81 repeats the processing of moving the next target nozzle above the mounting position and mounting the component at the mounting angle, and when it is determined that there is no component P to be mounted next, the component mounting processing is ended. In a case where component P picked up by the target nozzle has no polarity, that is, a case where there are multiple mounting angles, CPU 81 lowers the target nozzle while driving and controlling Q-axis driving device 60 such that the target nozzle moves to a mounting angle with a smaller movement amount among the multiple mounting angles and mounts component P at the mounting position on board S.

Figure 8:
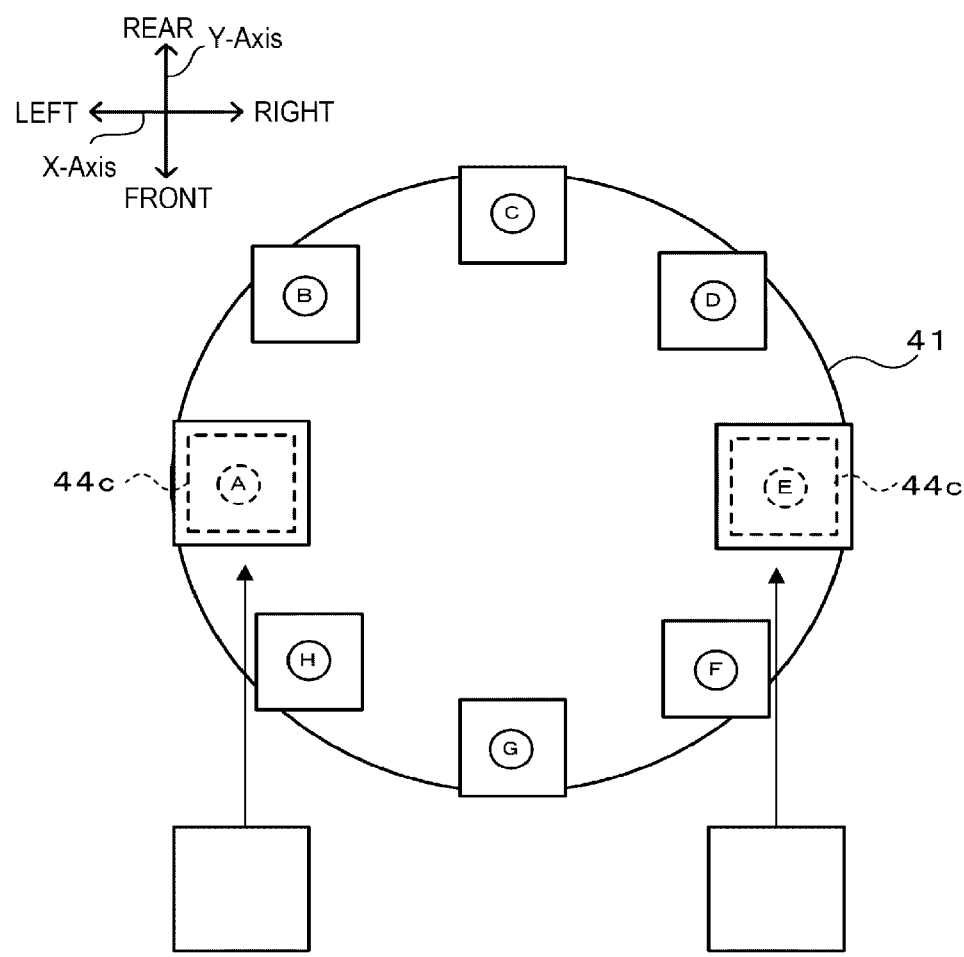
FIG. 8 An explanatory diagram showing a state of a pickup operation performed using suction nozzle 44c whose directionality information is four directions.

FIG. 8 is an explanatory diagram showing a state of a pickup operation performed using a special nozzle (suction nozzle 44c) whose directionality information is four directions. A case is considered where component supply device 20 supplies two components P at a predetermined interval in the right-left direction (X-axis direction) at a component angle of 0 degree, and mounting head 40 simultaneously picks up two components P with two target nozzles A and E. As shown, two target nozzles A and E are four-direction (90-degree rotational symmetry) suction nozzles 44c which can pick up component P only at nozzle angles of 0 degree, 90 degrees, 180 degrees, and 270 degrees, and are provided side by side at the same interval in the same direction as two components P supplied by component supply device 20. In addition, since two target nozzles A and E are in a relationship of having nozzle angles different from each other by 180 degrees, when the nozzle angle of first target nozzle A is 0 degree, the nozzle angle of second target nozzle E is 180 degrees. Therefore, two components P supplied at the component angle of 0 degree are simultaneously picked up by two target nozzles A and E as two target nozzles A and E are simultaneously lowered. Although not shown, even in a case where two target nozzles A and E are non-directional suction nozzles 44a which can pick up at any nozzle angle, or a case where two target nozzles A and E are two-direction (180-degree rotational symmetry) suction nozzles 44c which can pick up only at nozzle angles of 0 degree and 180 degrees, since component P can be picked up at the nozzle angles of 0 degree and 180 degrees, similarly, mounting head 40 can simultaneously pick up two components P with two target nozzles A and E.

Figure 9:
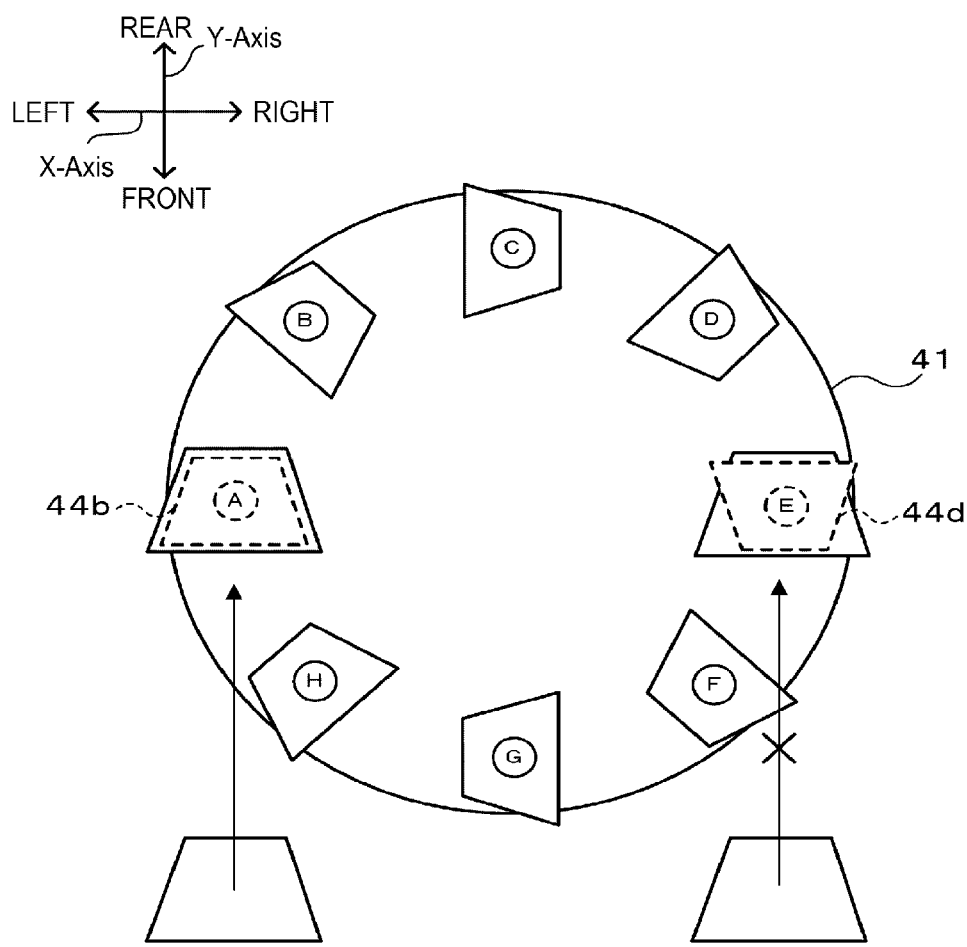
FIG. 9 An explanatory diagram showing a state of a pickup operation performed using suction nozzle 44d whose directionality information is one direction.

FIG. 9 is an explanatory diagram showing a state of a pickup operation performed using a special nozzle (suction nozzle 44d) whose directionality information is one direction. As shown, target nozzles A and E are one-direction suction nozzles 44d which can pick up component P only at a nozzle angle of 0 degree. For this reason, mounting head 40 lowers only first target nozzle A with the nozzle angle of target nozzle A at 0 degree and picks up component P with target nozzle A. At this time, the nozzle angle of second suction nozzle E is 180 degrees. After picking up with first target nozzle A, mounting head 40 lifts first target nozzle A and revolves or spins second target nozzle E 180 degrees to set the nozzle angle to 0 degree; mounting head 40 lowers only second target nozzle E and picks up component P.

Herein, a correspondence relationship between constituent elements of the present embodiment and constituent elements of the present disclosure will be clarified. Component supply device 20 of the present embodiment corresponds to a "component supply device" of the present disclosure, suction nozzle 44 corresponds to a "suction nozzle", mounting head 40 corresponds to a "head", Z-axis driving devices 70 and 75 correspond to a "lifting and lowering device", HDD 103 corresponds to a "storage device", and control device 80 corresponds to a "control device".

Component mounting system 1 of the embodiment described hereinbefore includes component mounter 10 having mounting head 40 that can revolve multiple nozzle holders 42, to which suction nozzles 44 are detachably mounted, in the circumferential direction and can simultaneously spin each nozzle holder 42 and Z-axis driving devices 70 and 75, which are provided at two locations (two revolving positions) on a revolving trajectory of multiple suction nozzles 44 and lift and lower suction nozzles 44 positioned at the two locations. In addition, component mounting system 1 includes HDD 103 that is a storage device that stores, in association with identification information of a suction nozzle to be used in picking up component P, any directionality information of "no directionality", "one direction", "two directions", and "four directions"

indicating a nozzle angle (spinning position) at which suction nozzle 44 can pick up. Then, component mounting system 1 (component mounter 10) acquires the identification information of suction nozzle 44 to be used in picking up component P, acquires the corresponding directionality information from HDD 103 based on the acquired identification information, and controls mounting head 40 and suction nozzle 44 such that component P supplied from component supply device 20 is picked up at a nozzle angle (spinning position) in accordance with the acquired directionality information. Accordingly, by determining an appropriate nozzle angle (spinning position) in accordance with the directionality information of suction nozzle 44, component mounting system 1 can efficiently pick up a component and mount the component on a target object.

In addition, component mounting system 1 of the present embodiment causes two suction nozzles 44, which are lifted and lowered at nozzle angles different from each other by 180 degrees by two Z-axis driving devices 70 and 75 (Z-shafts) included in mounting head 40, to substantially simultaneously pick up two components P supplied at the same interval as two suction nozzles 44. Accordingly, since time required for picking up components P can be shortened further, component mounting system 1 can further improve the productivity of a mounting board.

As a matter of course, the present disclosure is not limited to the embodiment described above, and may be implemented in various aspects insofar as the aspects belong to the technical scope of the present disclosure.

In the embodiment described above, mounting head 40 includes Z-axis driving devices 70 and 75 at the two locations on the revolution trajectory of nozzle holders 42. However, mounting head 40 may have one or three or more Z-axis driving devices (Z-shafts). The mounting head may acquire the direction of the suction nozzle, in which component P supplied to a component supply position can be picked up, from the directionality information of the suction nozzle and spin the suction nozzle in a direction with the smallest movement amount (rotation amount), among the acquired directions, to pick up component P. For example, in a case where the directionality information of the suction nozzle is "four directions" in which component P can be picked up only at nozzle angles of 0 degree, 90 degrees, 180 degrees, and 270 degrees and the current direction (nozzle angle) of the suction nozzle is 250 degrees, the mounting head can change the nozzle angle of the suction nozzle to 270 degrees to pick up component P. In addition, for example, in a case where the directionality information of the suction nozzle is "no directionality", since the suction nozzle can pick up component P in any direction (nozzle angle), the mounting head can pick up component P without changing the direction of the suction nozzle.

Although nozzle information (directionality information) is stored in HDD 103 of management device 100 in the embodiment described above, the nozzle information may be stored in a storage device provided in control device 80 of component mounter 10.

In the embodiment described above, "two-direction" suction nozzle 44b, "four-direction" suction nozzle 44b, and "one-direction" suction nozzle 44d have rectangular, square, and trapezoidal pickup surface shapes, respectively. However, without being limited to this, the pickup surface shape of a suction nozzle corresponding to each directionality may be any shape, for example, the pickup surface shape of the "four-direction" suction nozzle may be a cross shape, and the pickup surface shape of the "one-direction" suction nozzle may be a triangular shape.

INDUSTRIAL APPLICABILITY

The present disclosure is applicable to the manufacturing industry of component mounters.

REFERENCE SIGNS LIST 1 mounting system, 10 component mounter, 11 base, 12 housing, 12o opening section, 20 component supply device, 24 board conveyance device, 26 part camera, 28 nozzle station, 30 XY-robot, 31 X-axis guide rail, 32 X-axis slider, 33 Y-axis guide rail, 34 Y-axis slider, 36 X-axis motor, 37 X-axis position sensor, 38 Y-axis motor, 39 Y-axis position sensor, 40 mounting head, 41 head main body, 42 nozzle holder, 44 suction nozzle, 45 mark camera, 46 negative pressure supply/relief valve, 50 R-axis driving device, 51 R-shaft, 52 R-axis gear, 54 R-axis motor, 55 R-axis position sensor, 60 Q-axis driving device, 61, 62 Q-axis gear, 65 Q-axis motor, 66 Q-axis position sensor, 70, 75 Z-axis driving device, 71, 76 Z-axis motor, 72, 77 Z-axis slider, 73, 78 Z-axis position sensor, 80 control device, 81 CPU, 82 ROM, 83 HDD, 84 RAM, 85 input and output interface, 86 bus, 100 management device, 101 CPU, 102 ROM, 103 HDD, 104 RAM, 105 input and output interface, 107 input device, 108 display, P component, S board.

The invention claimed is:

1. A component mounting system configured to pick up a component supplied from a component supply device and to mount the component on a target object, the component mounting system comprising:
   multiple suction nozzles, each capable of picking up the component;
   a rotary head configured to hold the multiple suction nozzles in a circumferential direction, and to be capable of revolving each suction nozzle in the circumferential direction around a central axis of the rotary head and simultaneously spinning each suction nozzle around respective nozzle axes;
   a lifting and lowering device configured to lift and lower a suction nozzle at a predetermined revolving position, among the multiple suction nozzles;
   a storage device configured to store directionality information in association with identification information of the suction nozzles, the directionality information defining a nozzle angle of each of the suctions nozzles in which the component is able to be picked up, the directionality information including:
      no directionality in which the component supplied from the component supply device is able to be picked up at any nozzle angle; one direction in which the component supplied from the component supply device is able to be picked up only at one specific nozzle angle; two directions in which the component supplied from the component supply device is able to be picked up only at any one of two specific nozzle angles; and four directions in which the component supplied from the component supply device is able to be picked up only at any one of four specific nozzle angles, and
   a control device configured to acquire the identification information of a suction nozzle of the suction nozzles used in picking up the component, to acquire corresponding directionality information from the storage device based on the acquired identification information, and to control the head and the suction nozzle such that the component supplied from the component supply device is picked up at the nozzle angle in accordance with the acquired directionality information.

2. The component mounting system in accordance with claim 1,
wherein the directionality information of two directions indicates the suction nozzles have 180-degree rotational symmetry, and the directionality information of four directions indicates the suction nozzles have 90-degree rotational symmetry.

3. The component mounting system in accordance with claim 2,
wherein the component supply device has first and second component supply devices configured to respectively supply the components at positions spaced apart from each other at a predetermined pitch in a target object conveyance direction,
the lifting and lowering device has a first lifting and lowering device capable of lifting and lowering a suction nozzle at a first revolving position, among the multiple suction nozzles, and a second lifting and lowering device capable of lifting and lowering a suction nozzle at a second revolving position spaced apart from the first revolving position by a distance corresponding to the predetermined pitch in the target object conveyance direction, among the multiple suction nozzles,
the suction nozzle at the first revolving position and the suction nozzle at the second revolving position are in a relationship of having angles different from each other by 180 degrees, and
in a case where the directionality information corresponding to the acquired identification information is any one of the no directionality, the two directions, and the four directions, the control device controls the head, the suction nozzles, and the first and second lifting and lowering devices such that the suction nozzle at the first revolving position and the suction nozzle at the second revolving position substantially simultaneously pick up the component supplied by the first component supply device and the component supplied by the second component supply device.

* * * * *